United States Patent
Weng et al.

(10) Patent No.: US 6,700,811 B1
(45) Date of Patent: Mar. 2, 2004

(54) RANDOM ACCESS MEMORY DEVICE AND METHOD FOR DRIVING A PLATE LINE SEGMENT THEREIN

(75) Inventors: Chi-Ming Weng, Hsinchu (TW); Chin-Hsi Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/235,688

(22) Filed: Sep. 4, 2002

(51) Int. Cl.⁷ .............................................. G11C 11/22
(52) U.S. Cl. ......................................... 365/145; 365/72
(58) Field of Search ..................... 365/145, 72

(56) References Cited

U.S. PATENT DOCUMENTS 5,917,746 A * 6/1999 Seyyedy ..................... 365/145
6,330,180 B2 * 12/2001 Noro et al. .................. 365/145
6,560,138 B2 * 5/2003 Noro et al. .................. 365/145

* cited by examiner

*Primary Examiner*—Michael Tran
(74) *Attorney, Agent, or Firm*—Stout, Uxa, unyan & Mullins, LLP

(57) ABSTRACT

A random access memory device includes a number of memory cells, with word lines, plate lines, and bit lines coupled to the memory cells. A switch, controlled by a word line, couples one end of the plate line to a first global plate line, while another switch, controlled by a second global plate line, couples the one end of the plate line to a reference voltage. The plate lines are charged by the first global plate line, which improves operational speed of the device and reduces loading of the word lines.

25 Claims, 5 Drawing Sheets

RANDOM ACCESS MEMORY DEVICE AND METHOD FOR DRIVING A PLATE LINE SEGMENT THEREIN

BACKGROUND OF THE INVENTION

1. Field of the Invention

The present invention relates generally to a random access memory device and, more particularly, to a nonvolatile ferroelectric random access memory device with a segmented plate line and a method for driving a plate line segment.

2. Description of Related Art

Random access memory devices are well known in the art. One type of random access memory is a ferroelectric random access memory (FRAM), which employs a ferroelectric capacitor as the storage element for each memory cell. A FRAM stores a logic state based on the electrical polarization of the corresponding ferroelectric capacitor. When a sufficient voltage potential difference (i.e., above the switching threshold or coercive voltage level) is applied to the plates of the ferroelectric capacitor, the ferroelectric material of the capacitor is polarized in the direction of the electric field.

Typically, one plate of a ferroelectric capacitor is coupled to a bit line via an access transistor and the other plate is coupled to a plate line. For example, FIG. 1 illustrates a FRAM circuit having a conventional segmented plate line scheme. As shown, a global plate line (GPL) drives a number of segmented plate lines (PL00 through PLNN) via access transistors, a word line decoder (WL DEC) drives a number of word lines (WL0 through WLN), and a sense amplifier/column decoder (labeled Sense Amplifier & Column Decoder Circuit) is coupled to the ferroelectric capacitors via corresponding bit lines and access transistors.

In standby, the word lines and the segmented plate lines are at a low voltage level. During operation, one word line activates one row of the segmented plate lines which is driven by the global plate line. A drawback of this scheme is that a segmented plate line pull-down circuit (one of which is circled in FIG. 1 and labeled PLPD) is required, which increases the loading of the word line and the overall size of the circuitry (i.e., chip area). Thus, there is a need for an improved FRAM device having fewer components and having word lines with less loading.

Another FRAM circuit is shown in FIG. 2 having a segmented plate line scheme as disclosed in U.S. Pat. No. 6,201,727, which is incorporated herein by reference in its entirety. As shown in FIG. 2 along with the respective timing diagram shown in FIG. 3, in standby, all segmented plate lines (PLS0 through PLSm) are coupled to ground by driving a signal on PRCHG control lines high. During access, a signal is driven high on an SEL control line, and a word line (one of WL0 through WLm) is activated, resulting in the selected word line charging one of the local segmented plate lines (one of PLS0 through PLSm). One drawback of this scheme is that the extent of the loading of the word line and the plate lines can limit the voltage level ramp-up, which in turn can limit device operation speed. Thus, the operational speed can be limited. As a result, there is a need for an improved FRAM device having reduced loading of the word lines and plate lines and, further, having memory cells with improved access time and cycle time.

SUMMARY OF THE INVENTION

The present invention seeks to meet these needs of the prior art by providing, in accordance with one aspect, random access memory (RAM) devices with reduced loading on the word lines and plate lines. The reduced loading of the word lines and plate lines can enable increased voltage level ramp-up times on the word lines and plate lines without area penalty.

The present invention further seeks to address the prior art needs by providing a method of operating a random access memory device wherein plate lines are charged by a local plate line decoder or other circuit, instead of being charged directly by the row decoder. Moreover, pull-down circuits are not connected, so the area penalty is small. Consequently, by operation of the row decoder selecting local plate lines instead of actually charging them, access times and cycle times of the random access memory device can be increased.

To achieve these and other advantages and in accordance with a purpose of the present invention, as embodied and broadly described herein, the invention provides random access memory devices and methods for operating the devices. For example, in accordance with one aspect of the present invention, a random access memory device includes a number of memory cells, with word lines, plate lines, and bit lines coupled to the memory cells. A switch, controlled by a word line, couples one end of the plate line to a first global plate line, while another switch, controlled by a second global plate line, couples the one end of the plate line to a reference voltage. The plate lines are charged by the first global plate line, which improves operational speed of the device, reduces loading of the word lines, and improves the access time and cycle time of the memory cells.

In accordance with another aspect of the present invention, a random access memory device includes a plurality of memory cells, a word line, a plate line, a plurality of bit lines, a first global plate line, a second global plate line, a first switch circuit, and a second switch circuit. The word line, plate line, and bit lines are coupled to the memory cells, and each of the memory cells is arranged at an intersection of the word line and a corresponding bit line. The first switch circuit, responsive to a voltage potential asserted on the word line, couples one end of the plate line to the first global plate line. The second switch circuit, responsive to a voltage potential asserted on the second global plate line, couples the one end of the plate line (and the first switch circuit) to a reference voltage.

In accordance with yet another aspect of the present invention, a random access memory device includes a memory cell array, a plurality of word lines and a row decoder. The row decoder selects one of the word lines and activates the selected word line. The memory cell array is divided into a plurality of memory blocks, with each of the memory blocks including a plurality of memory cells, a plurality of plate line segments, a plurality of bit lines, a first global plate line, a second global plate line, a local plate line decoder, a plurality of first switch circuits, and a plurality of second switch circuits. In the memory block, the memory cells are arranged at intersections of the word lines and the bit lines. The plate line segments couple to the memory cells, and one end of each of the plate line segments is coupled to a corresponding one of the first switch circuits and the second switch circuits. The first switch circuits further are coupled to the first global plate line, and the second switch circuits are further coupled to reference voltages. In this case, each of the first switch circuits is controlled by a corresponding word line, and each of the second switch circuits is controlled by the second global plate line.

Furthermore, in accordance with another aspect of the present invention, a method for driving a plate line in a random access memory device is disclosed. The method includes asserting a first voltage potential on a word line to switch a first switch circuit off to decouple a plate line from a first global plate line; asserting a second voltage potential on a second global plate line to switch a second switch circuit on to charge the plate line with a reference voltage; asserting a third voltage potential on the word line to switch the first switch circuit on so as to couple the plate line to the first global plate line; asserting a fourth voltage potential on the second global plate line to switch the second switch circuit off so as to decouple the plate line from the reference voltage; and asserting a signal on the first global plate line such that the plate line has a plate line voltage.

In each of the foregoing aspects, the present invention provides a switch that is controlled by a word line and that couples one end of a plate line to a global plate line, and further provides another switch that is controlled by a second global plate line and that couples the one end of the plate line to a reference voltage. The plate lines are charged by the first global plate line, which can improve operational speed of the device, reduce loading of the word lines, and improve the access time and cycle time of the memory cells.

Any feature or combination of features described herein are included within the scope of the present invention provided that the features included in any such combination are not mutually inconsistent as will be apparent from the context, this specification, and the knowledge of one of ordinary skill in the art.

Additional advantages and aspects of the present invention are apparent in the following detailed description and claims. It is to be understood that both the foregoing general description and the following detailed description are exemplary, and are intended to provide further explanation of the invention as claimed.

Figure 1:
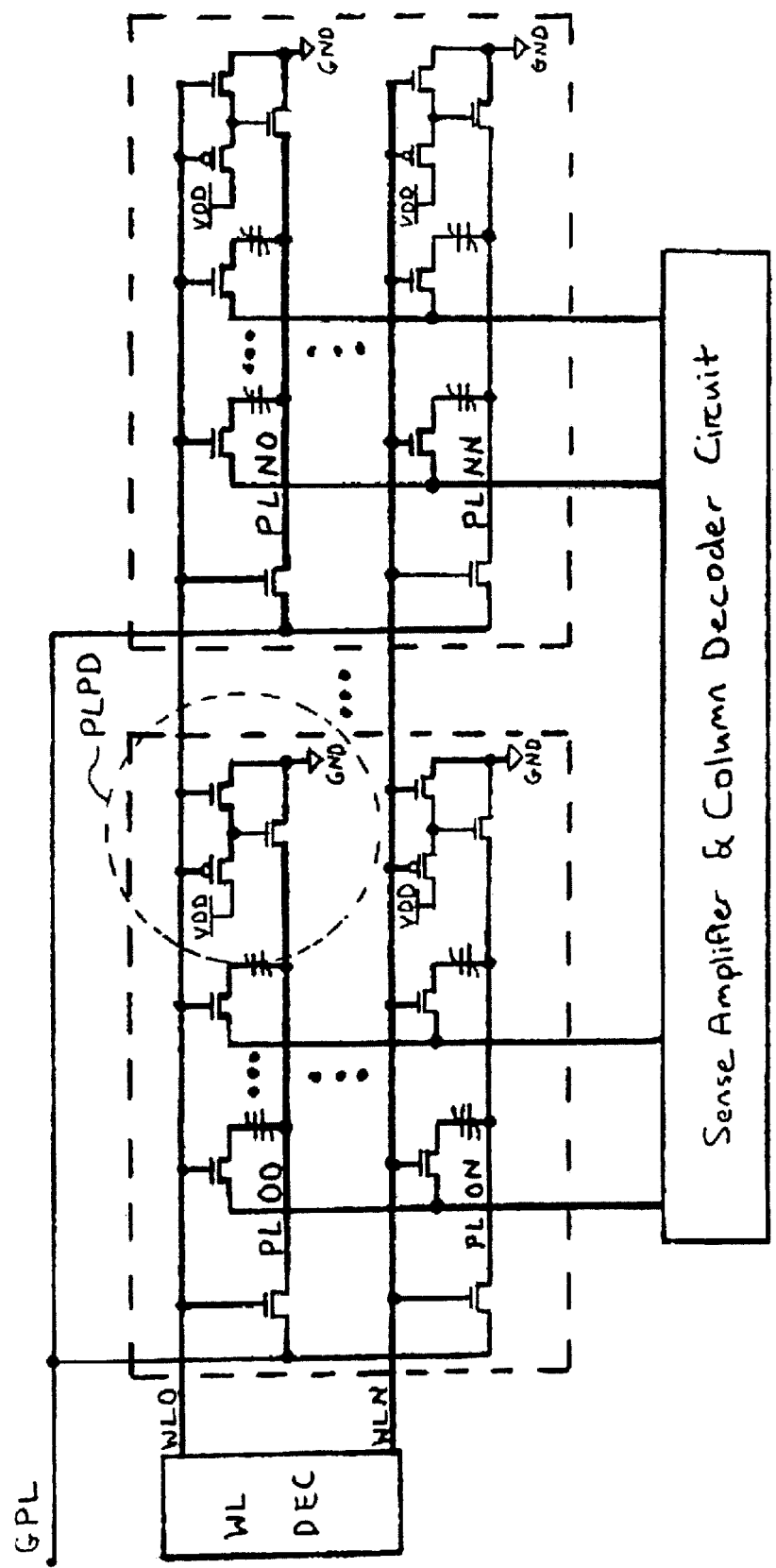
FIG. 1 shows a circuit having a conventional segmented plate line scheme.
Figure 2:
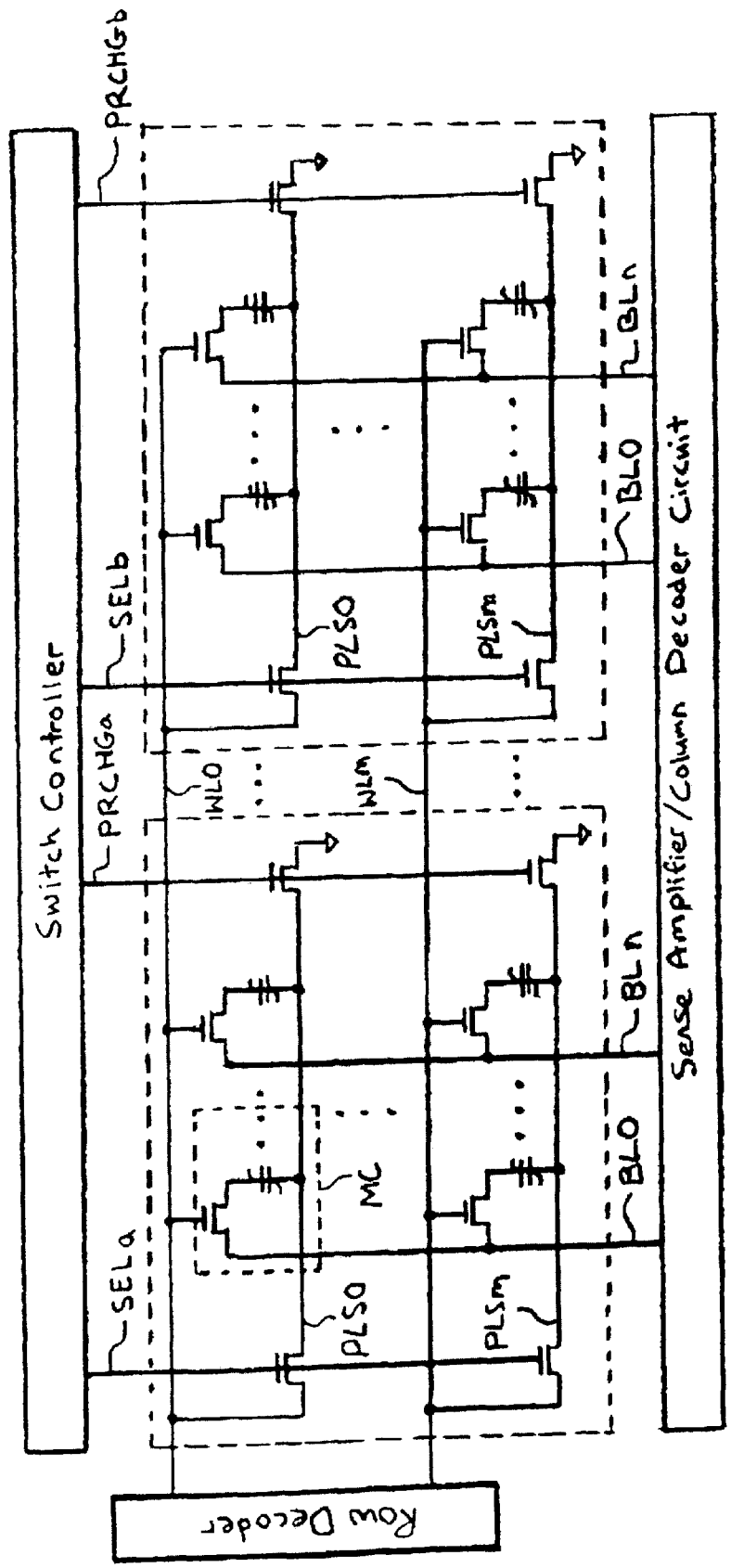
FIG. 2 shows another circuit having a conventional segmented plate line scheme.
Figure 3:
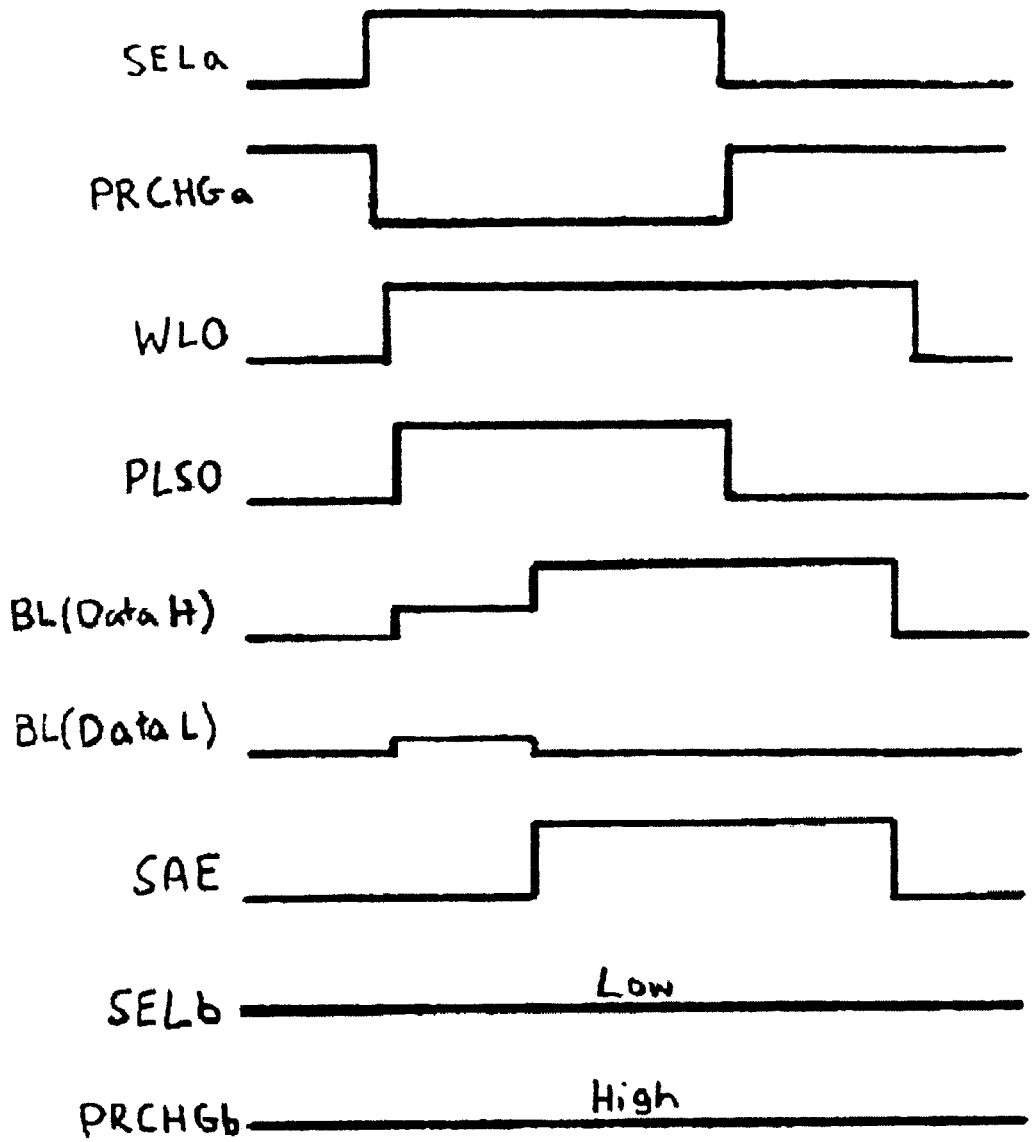
FIG. 3 shows a timing diagram for the circuit of FIG. 2.

The preferred embodiments of the present invention and their advantages are best understood by referring to the detailed description that follows.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same reference numbers are used in the drawings and the description to refer to the same or like parts. It should be noted that the drawings are in simplified form and are not to scale. In reference to the disclosure herein, for purposes of convenience and clarity only, directional terms, such as, top, bottom, left, right, up, down, above, below, beneath, rear, and front, are used with respect to the accompanying drawings. Such directional terms should not be construed to limit the scope of the invention in any manner.

Although the disclosure herein refers to certain illustrated embodiments, it is understood that these embodiments are presented by way of example and not by way of limitation. The intent of the following detailed description is to cover all modifications, alternatives, and equivalents as may fall within the spirit and scope of the invention as defined by the appended claims. It is to be understood and appreciated that the process steps and structures described herein do not cover a complete process flow for the structure and operation of, for example, the random access memory device and associated structures. The present invention can be practiced in conjunction with various memory devices and associated components that are used in the art, and only so much of the commonly practiced components and method steps are included herein as are necessary to provide an understanding of the present invention.

Figure 4:
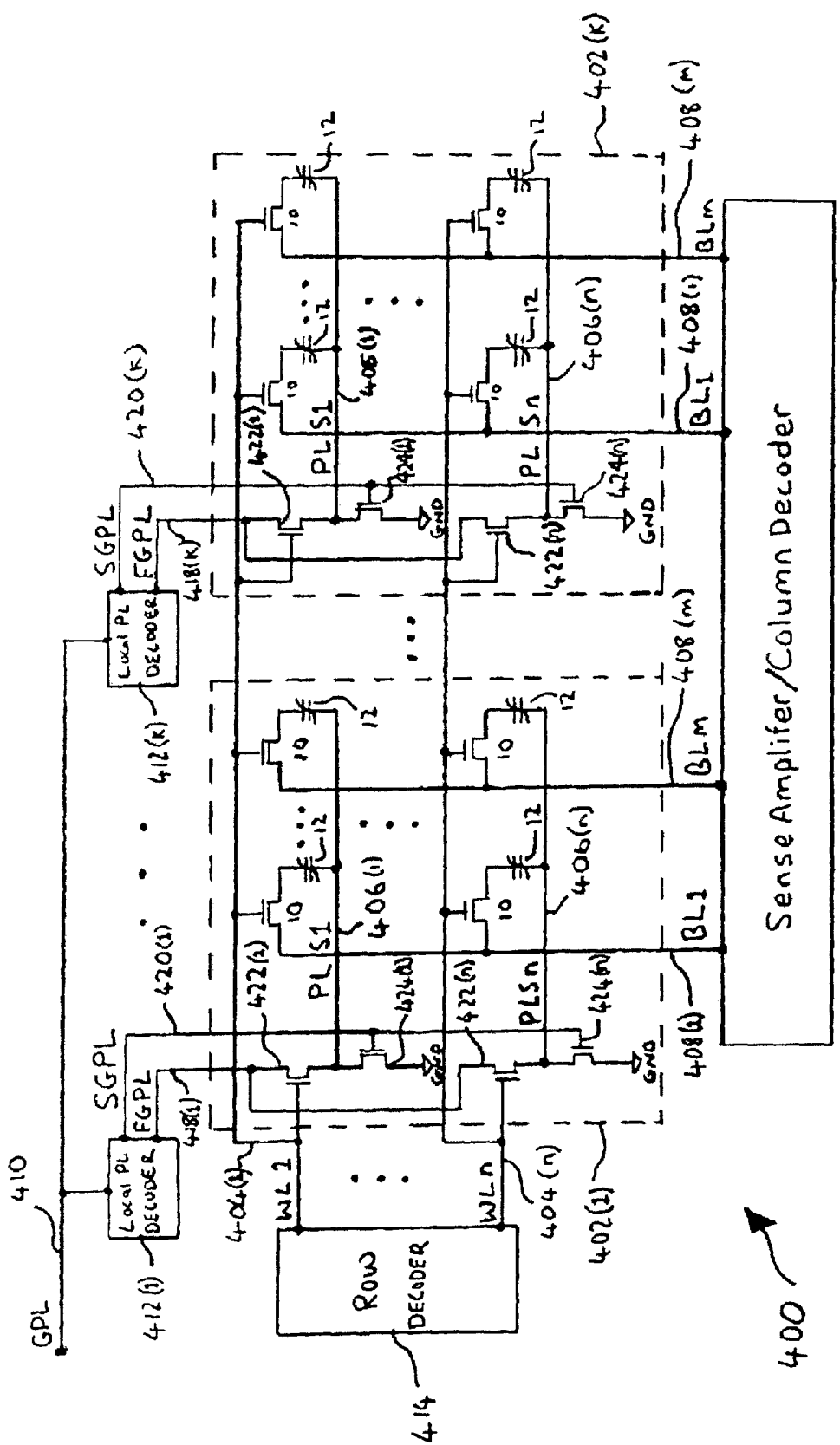
FIG. 4 shows a circuit having a segmented plate line scheme in accordance with an embodiment of the present invention.

FIG. 4 shows a circuit 400 for a random access memory having a segmented plate line scheme in accordance with an embodiment of the present invention. The circuit 400 includes a memory cell array that stores data information and is divided into a plurality of memory blocks 402, which are separately referenced as memory blocks 402(1) through 402(k) with k representing the number of the last memory block 402 in the memory cell array. A plurality of word lines 404 (also labeled WL1 through WLn), which are separately referenced as word lines 404(1) through 404(n) with n representing the number of the last word line 404, are arranged in parallel in a row direction and extend through the memory blocks 402.

Each memory block 402 has a plurality of plate line segments 406 (also labeled PLS 1 through PLSn and also referred to herein as local plate lines), which are referenced separately as plate line segments 406(1) through 406(n) with n representing the number of the last plate line segment 406. The plate line segments 406 are arranged in parallel in the row direction within each memory block 402. A plurality of bit lines 408 (also labeled BL1 through BLm), which are referenced separately as bit lines 408(1) through 408(m) with m representing the number of the last bit line 408, are arranged in parallel in a column direction. Thus, there are m bit lines in each memory block 402. The plate line segments 406(1) through 406(n) in the respective memory blocks 402 correspond to the word lines 404(1) through 404(n), respectively.

A plurality of memory cells are disposed within each memory block 402, generally arranged in rows, with each memory cell having an access transistor 10 and a ferroelectric capacitor 12. Each access transistor 10 has a gate coupled to one of the word lines 404 corresponding to the row of the associated memory cell. Each ferroelectric capacitor 12 has one plate coupled to a corresponding bit line 408 via a corresponding access transistor 10 and another plate coupled to a corresponding plate line segment 406.

One end of each plate line segment 406 is connected to a first global plate line 418 (also labeled FGPL and separately referenced 418(1) through 418(k)) through a corresponding transistor 422 (e.g., an NMOS transistor) and to a reference voltage through a corresponding transistor 424 (e.g., an NMOS transistor). The transistors 422 and 424 are separately referenced as transistors 422(1) through 422(n) and transistors 424(1) through 424(n), respectively, and are associated with the corresponding plate line segments 406(1) through 406(n) within each memory block 402.

Each transistor 422 (referred to herein also as a first switch circuit) performs a switching operation responsive to a voltage potential asserted on a corresponding word line 404. Each transistor 424 (referred to herein also as a second switch circuit) performs a switching operation responsive to a voltage potential asserted on a second global plate line 420 (also labeled SGPL and separately referenced 420(1) through 420(k)). A row decoder 414 determines which word line 404 to select and drive (i.e., assert the appropriate voltage potential on each word line 404) in response to a received row address.

A local plate line (PL) decoder 412 (separately referenced as 412(1) through 412(k)) receives a global plate line 410 (also labeled GPL) and determines the appropriate voltage potential to assert on the associated first global plate line 418 and the associated second global plate line 420. As shown in FIG. 4, the first global plate lines 418(1) through 418(k), the second global plate lines 420(1) through 420(k), and the local plate line decoders 412(1) through 412(k) are associated respectively with the memory blocks 402(1) through 402(k).

As described herein, each of the memory blocks 402(1) through 402(k) has the same general structure. It should also be understood that the first global plate lines 418 charge the associated plate line segments 406 through the corresponding transistors 422. Consequently, the word lines 404 only control the access transistors 10 and the transistors 422 rather than drive (or charge) the plate line segments 406. Thus, the loading of the word lines 404 is reduced as compared to conventional segmented plate line schemes. Furthermore, the techniques described herein are applicable to various types of random access memories employing line-driven schemes, such as for example plate-line driven or bit-line driven operation schemes.

Figure 5:
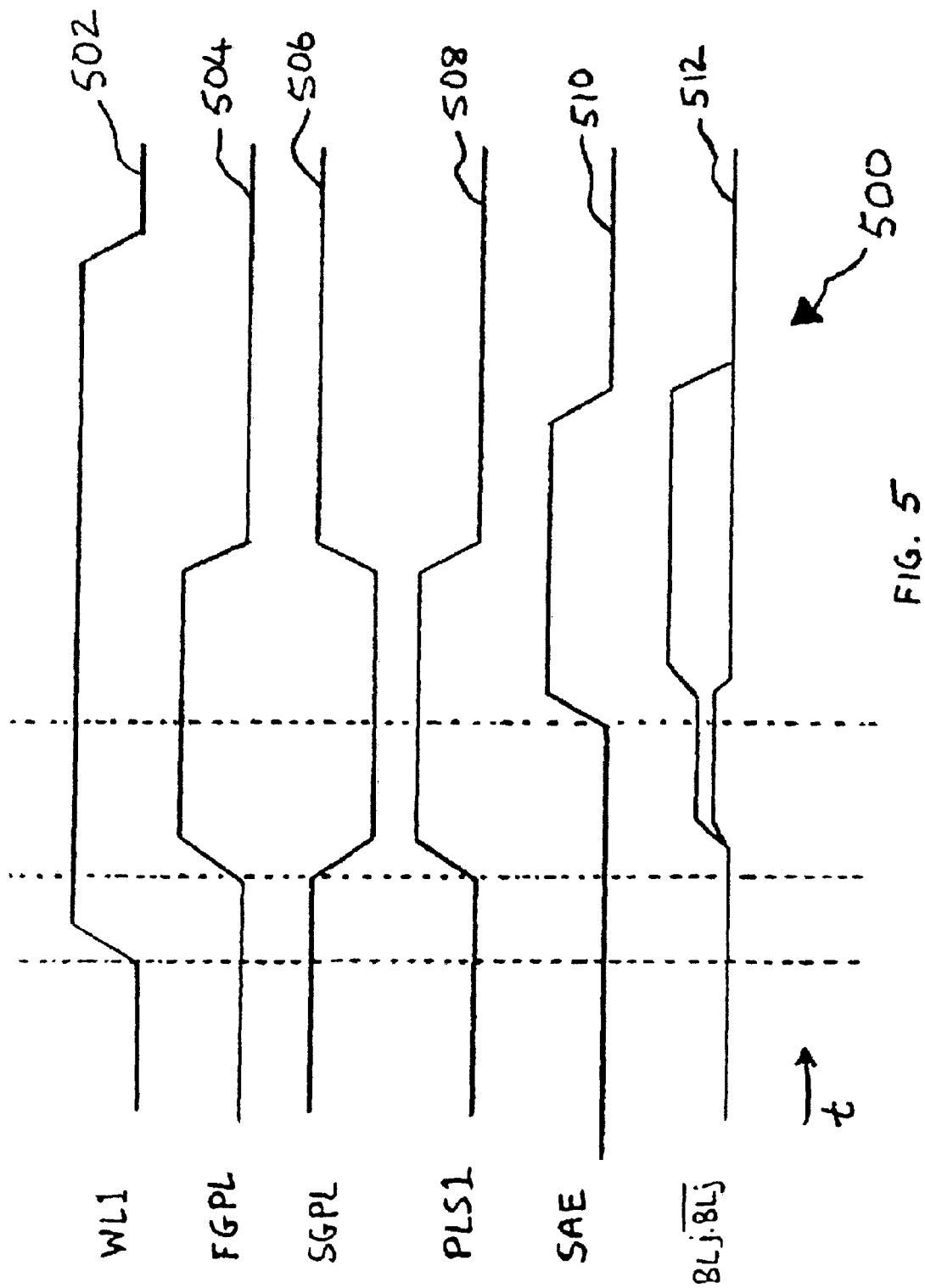
FIG. 5 shows an exemplary timing diagram for the circuit of FIG. 4 in accordance with an embodiment of the present invention.

FIG. 5 shows an exemplary timing diagram 500 for the circuit of FIG. 4 in accordance with an embodiment of the present invention. The timing diagram 500 illustrates waveforms for signal timing and control signal behavior for a plate-line driven example for the circuit 400. The timing diagram 500 includes a waveform 502 for the word line 404(1) (labeled WL1), a waveform 504 for the first global plate line 418 (labeled FGPL), a waveform 506 for the second global plate line 420 (labeled SGPL), a waveform 508 for the plate line segment 406(1) (labeled PLS1), a waveform 510 for a sense amplifier enable signal (labeled SAE), and a waveform 512 for one of the bit lines 408(1) through 408(m) along with its corresponding reference bit line (labeled BLj, BLj NOT).

In terms of general operation for this example, in standby, the second global plate line 420 is pulled high (i.e., a high logical voltage level is asserted on the second global plate line 420 by the local plate line decoder 412) and the first global plate line 418 is pulled low (i.e., a low logical voltage level is asserted on the first global plate line 418 by the local plate line decoder 412). This configuration is illustrated in FIG. 5 by the initial values of the waveforms 504 and 506. It should be understood that the first global plate line 418 and the second global plate line 420 have a 180° phase difference. Thus, each of the plate line segments 406 is charged with a reference voltage. In this exemplary embodiment, the reference voltage is at a ground voltage level (labeled GND in FIG. 4), but the reference voltage level may be set to a level other than ground depending upon the application. Thus, for this example, each of the plate line segments 406 is grounded.

During operation of the circuit 400, the row decoder 414 decodes received signals (row address lines to the row decoder are not shown) and asserts, for example, a high logical voltage level on the word line 404(1). In other words, the row decoder 414 activates the word line 414(1), as illustrated by the waveform 502, which switches on the transistor 422(1) and couples the first global plate line 418(1) to the plate line segment 406(1). The second global plate line 420 is pulled to a low logical voltage level and the first global plate line 418 is pulled to a high logical voltage level by the local plate line decoder 412 due to a signal received through the global plate line 410. Accordingly, the plate line segment 406(1) is driven to a high logical voltage level by the first global plate line 418. Specifically, the first global plate line 418 charges the plate line segment 406(1). At the same time, the other plate line segments 406(2) through 406(n) remain at a low logical voltage level because the corresponding word lines 404(2) through 404(n) apply a low logical voltage level to the gates of the associated transistors 422(2) through 422(n) and prevent the first global plate line 418 from charging the plate line segments 406(2) through 406(n).

The bit lines 408 and reference bit lines (not shown) are driven to different levels (as shown in FIG. 5 by the waveform 512), and a sense amplifier/column decoder 416 (also referred to herein as a sense amplifier) is enabled to sense the data values from the bit lines 408 and reference bit line. The sense amplifier 416 is enabled, for example, after receipt of a sense amplifier enable (SAE) signal as illustrated by the waveform 510. Subsequently, after the data is read out of the selected memory cells, it is necessary to write back the data into the ferroelectric capacitors 12 through the associated access transistors 10 if the data is obtained through a destructive read.

For example, the sense amplifier/column decoder 416 selects the appropriate bit lines 408 in response to a column address, detects and amplifies a signal on the selected bit lines 408, and provides a corresponding output data signal during a read cycle. During a write cycle, the sense amplifier/column decoder 416 is used as a driver for writing either a logic one or a logic zero into the memory cells via the bit lines 408.

In accordance with embodiments of the present invention, the plate line segments 406 are not driven directly by the word lines 404. Thus, the loading of the word lines 404 is decreased and the word line voltage level ramp-up speeds can be increased. Furthermore, the local plate line decoder 412 provides the decoding for and drives the respective first global plate line 418 and the second global plate line 420. Thus, the loading of the local plate line decoder 412 can be less than prior art global plate lines and its voltage level ramp-up speed to drive the plate line segments 406 can be increased. Because the voltage level ram-up speeds of the word line 404 and the plate line segments 406 can be increased, the operational speed of the RAM device, such as exemplified by the circuit 400, is also increased relative to conventional schemes.

Embodiments described above illustrate but do not limit the invention. It should also be understood that numerous modifications and variations are possible in accordance with the principles of the present invention. For example, the number of memory blocks can be varied from one to many, depending on the amount and characteristics of the memory required. Furthermore, the number of memory cells within each row and the number of memory cells within a memory block may vary, which in turn determines the number of word lines, plate line segments, and bit lines. The row decoder may be a single decoder or divided into a number of decoders for the memory blocks. Similarly, a single local plate line decoder may be associated with each memory block or one or more of the local plate line decoders may be combined to provide switching control for more than one memory block. Accordingly, the scope of the invention is defined only by the following claims.

The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

We claim:

1. A random access memory device, comprising:
a plurality of memory cells;
a word line coupled to the memory cells;
a plate line coupled to the memory cells;
a plurality of bit lines, wherein each of the bit lines is coupled to at least one of the memory cells;
a first global plate line;
a second global plate line;
a first switch circuit, responsive to a first signal asserted on the word line, for coupling one end of the plate line to the first global plate line; and
a second switch circuit, responsive to a second signal asserted on the second global plate line, for coupling the one end of the plate line to a reference voltage.

2. The device of claim 1, wherein each of the memory cells comprises an access transistor having a gate coupled to the word line and a ferroelectric capacitor having a first plate coupled to a corresponding bit line via the access transistor and a second plate coupled to the plate line.

3. The device of claim 1, wherein the first switch circuit comprises a first transistor having a gate coupled to the word line for receiving the first signal asserted on the word line.

4. The device of claim 3, wherein when the first switch circuit is switched to couple the one end of the plate line to the first global plate line, a current path is formed and the first global plate line charges the plate line with a plate line voltage.

5. The device of claim 1, wherein the second switch circuit comprises a second transistor having a gate coupled to the second global plate line for receiving the second signal asserted on the second global plate line.

6. The device of claim 5, wherein when the second switch circuit is switched to couple the one end of the plate line to the reference voltage, a current path is formed and the plate line is charged with the reference voltage.

7. The device of claim 1, wherein the reference voltage is at a ground voltage potential.

8. The device of claim 1, further comprising a sense amplifier coupled to the plurality of bit lines, wherein data stored in the plurality of memory cells is read by the sense amplifier via the plurality of bit lines.

9. The device of claim 1, further comprising a plate line decoder coupled to the first global plate line and the second global plate line.

10. The device of claim 1, wherein the random access memory device is a ferroelectric random access memory device.

11. A random access memory device, comprising:
a plurality of memory blocks;
a plurality of word lines, each of the word lines being coupled to each of the memory blocks; and
a row decoder for selecting one of the word lines, wherein each of the memory blocks comprises:
a plurality of memory cells, the word lines being coupled to the memory cells;
a plurality of plate line segments coupled to the memory cells;
a plurality of bit lines coupled to the memory cells, wherein the memory cells are arranged at intersections of corresponding word lines and bit lines;
a first global plate line;
a second global plate line;
a local plate line decoder for asserting signals on the first global plate line and the second global plate line;
a plurality of first switch circuits, each of the first switch circuits coupling one end of one of the plate line segments to the first global plate line and being responsive to a first signal asserted on a corresponding one of the word lines; and
a plurality of second switch circuits, each of the second switch circuits coupling the one end of one of the plate lines to a corresponding reference voltage and being responsive to a second signal asserted on the second global plate line.

12. The device of claim 11, wherein each of the memory cells in the respective memory blocks comprises an access transistor having a gate coupled to a corresponding word line, and a ferroelectric capacitor having a first plate coupled to a corresponding bit line via the access transistor and a second plate coupled to a corresponding plate line segment.

13. The device of claim 11, wherein each of the first switch circuits comprises a first transistor having a gate coupled to a corresponding word line for receiving the first signal asserted on the corresponding word line.

14. The device of claim 11, wherein each of the second switch circuits comprises a second transistor having a gate coupled to the second global plate line for receiving the second signal asserted on the second global plate line.

15. The device of claim 11, wherein the reference voltage is at a ground voltage potential.

16. The device of claim 11, wherein the random access memory device is a ferroelectric random access memory device.

17. The device of claim 11, further comprising a sense amplifier coupled to the plurality of bit lines, wherein data stored in the plurality of memory cells is read by the sense amplifier via the plurality of bit lines.

18. A method for driving a plate line in a random access memory device, the random access memory device comprising a plurality of memory cells, a word line coupled to the memory cells, a plate line coupled to the memory cells, a plurality of bit lines, a first global plate line, a second global plate line, a first switch circuit responsive to a first signal asserted on the word line for coupling one end of the plate line to the first global plate line, and a second switch circuit responsive to a second signal asserted on the second global plate line for coupling the one end of the plate line to a reference voltage, the method comprising:
asserting the first signal at a first voltage level on the word line to switch the first switch circuit to decouple the plate line from the first global plate line;
asserting the second signal at a second voltage level on the second global plate line to switch the second switch circuit to couple the reference voltage to the plate line and charge the plate line with the reference voltage;
asserting the first signal at a third voltage level on the word line to switch the first switch circuit to couple the plate line to the first global plate line;
asserting the second signal at a fourth voltage level on the second global plate line to switch the second switch circuit to decouple the plate line from the reference voltage; and asserting a signal on the first global plate line such that the plate line has a plate line voltage.

19. The method of claim 18, wherein:

the step of asserting the second signal at a second voltage level comprises a step of charging the plate line with a ground voltage potential; and the step of asserting the second signal at a fourth voltage level comprises a step of decoupling the plate line from the ground voltage potential.

20. The method of claim 18, further comprising a step of sensing data stored in the plurality of memory cells via the plurality of bit lines.

21. The method of claim 18, wherein the step of asserting the first signal at a third voltage level comprises a step of the step of asserting the first signal at high or logic "1" voltage level on the word line to switch the first switch circuit to couple the plate line to the first global plate line, the first global plate line comprising a low or logic "0" voltage level.

22. The method of claim 21, wherein the step of asserting the second signal at a fourth voltage level comprises a step of asserting the second signal at a low or logic "0" voltage level on the second global plate line to switch the second switch circuit to decouple the plate line from the reference voltage.

23. The method of claim 22, wherein the step of asserting a signal on the first global plate line comprises a step of asserting a high or logic "1" voltage level on the first global plate line such that the plate line has a plate line voltage.

24. The method of claim 23, wherein the step of asserting the second signal at a fourth voltage level and the step of asserting a signal on the first global plate line occur at the same time.

25. The method of claim 18, wherein the step of asserting the second signal at a fourth voltage level and the step of asserting a signal on the first global plate line occur at the same time.

* * * * *